United States Patent [19]
Lee et al.

[11] Patent Number: 5,397,727
[45] Date of Patent: Mar. 14, 1995

[54] METHOD OF FORMING A FLOATING GATE PROGRAMMABLE READ ONLY MEMORY CELL TRANSISTOR

[75] Inventors: Roger Lee; Fernando Gonzalez, both of Boise, Id.

[73] Assignee: Micron Technology, Inc., Boise, Id.

[21] Appl. No.: 277,918

[22] Filed: Jul. 20, 1994

[51] Int. Cl.⁶ .................................... H01L 21/70
[52] U.S. Cl. ............................... 437/43; 437/29; 437/52; 437/70
[58] Field of Search ............... 437/28, 29, 43, 48, 437/52, 70; 257/315

[56] References Cited

U.S. PATENT DOCUMENTS 5,004,701  4/1991  Motokawa .................... 437/48
5,227,326  7/1993  Walker ......................... 437/43

FOREIGN PATENT DOCUMENTS 3257846  11/1991  Japan ........................... 437/29

*Primary Examiner*—Tom Thomas
*Attorney, Agent, or Firm*—Wells, St. John, Roberts, Gregory & Matkin

[57] ABSTRACT

A method of forming a floating gate programmable read only memory cell transistor in a semiconductor substrate includes, a) providing a fully patterned floating gate atop the semiconductor substrate; b) oxidizing the semiconductor substrate to define a field oxide region and an active region, the floating gate being provided within the active region; c) providing a floating gate dielectric layer outwardly of the floating gate; d) after providing the floating gate and the field oxide region, masking the active region while conducting a channel stop implant through the field oxide region to within the substrate beneath the field oxide region; and e) after conducting the channel stop implant, providing a patterned word line over the floating gate dielectric layer.

10 Claims, 4 Drawing Sheets

METHOD OF FORMING A FLOATING GATE PROGRAMMABLE READ ONLY MEMORY CELL TRANSISTOR

TECHNICAL FIELD

This invention relates generally to methods of forming a floating gate programmable read only memory cell in a semiconductor substrate. More particularly, this invention concerns electrical isolation within a semiconductor substrate between adjacent floating gate programmable transistors of read only memory cells.

BACKGROUND OF THE INVENTION

In order to isolate floating gate transistor cells, it is necessary to prevent the formation of channels within bulk areas of the underlying substrate. Accordingly, a large field threshold voltage ($V_T$) is desirable within the substrate between adjacent floating gates. Such is typically accomplished by optimizing the thickness of intervening field oxide and by providing a raised doping concentration within the substrate beneath the field oxide. If field oxide were made sufficiently thick, it alone could cause a high enough threshold voltage to prevent formation of undesired parasitic channels. Unfortunately, thick field oxide leads to other processing difficulties. To achieve a sufficiently large field threshold voltage with thinner field oxide layers, doping under the field oxide is typically increased. The resultant implant is typically referred to as a "channel stop".

The prior art provides such implants either before or after field oxide formation. For example with respect to pre-field oxide formation, a conductivity enhancing impurity of an appropriate type would be implanted into the silicon substrate in regions where field oxide will subsequently be formed. During field oxidation, the implant experiences both segregation and oxidation-enhanced diffusion. Thus, relatively high boron doses are needed in order for acceptable field threshold voltages to be achieved. This also implies that the peak of the dopant implant must be deep enough so that it is not absorbed by the growing field-oxide interface. However if the channel stop doping is too heavy, it will cause high source/drain-to-substrate capacitances, and will reduce source/drain-to-substrate pn junction breakdown voltages.

With respect to post-field oxide formation implantation, ion implantation of the desired dopant is conducted through the field oxide at a selected energy and dose to position a channel stop implant immediately therebeneath.

An example prior art construction and problems associated therewith is described with reference to FIG. 1. There illustrated is a semiconductor wafer fragment 10 comprised of a bulk substrate or well region 12, gate oxide region 14, and field oxide region 16. Outline area 18 depicts a region which will be doped subsequently for formation of a source or drain of a floating gate programmable read only memory cell transistor. Region 20 depicts the formed and desired outline of a channel stop implant region effective for isolating region 18 from other source/drain areas of other transistors formed within bulk substrate 12.

Regardless of pre or post field oxide formation implanting, lateral diffusion of the implant material undesirably causes encroachment into the adjacent active area. Inherent subsequent heating of the substrate, the result of subsequent depositions and other processing, can typically cause implant region 20 to expand for example to outline 22 depicted in FIG. 1. This diffusion is undesirably magnified in the fabrication of floating gate transistor cells which utilize ONO as one of the dielectric layers. The steps utilized to form ONO dielectric layers occur at high temperatures which promotes redistribution of the implant.

Accordingly, such redistribution raises the dopant surface concentration near the edge of the field oxide, causing the threshold voltage to undesirably increase in that region of the active device. As a result, the edge of the device will not conduct as much current as the interior portion, and the transistor will behave as if it were a narrower device. The effect is also undesirably enhanced as the dose of the channel stop implant is increased.

It would be desirable to overcome some of these drawbacks in methods specific to forming floating gate programmable read only memory cell transistors.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a floating gate programmable read only memory cell transistor in a semiconductor substrate comprises the following steps:

providing a fully patterned floating gate atop the semiconductor substrate;

oxidizing the semiconductor substrate to define a field oxide region and an active region, the floating gate being provided within the active region;

providing a floating gate dielectric layer outwardly of the floating gate;

after providing the floating gate and the field oxide region, masking the active region while conducting a channel stop implant through the field oxide region to within the substrate beneath the field oxide region; and after conducting the channel stop implant, providing a patterned word line over the floating gate dielectric layer.

Figure 1:
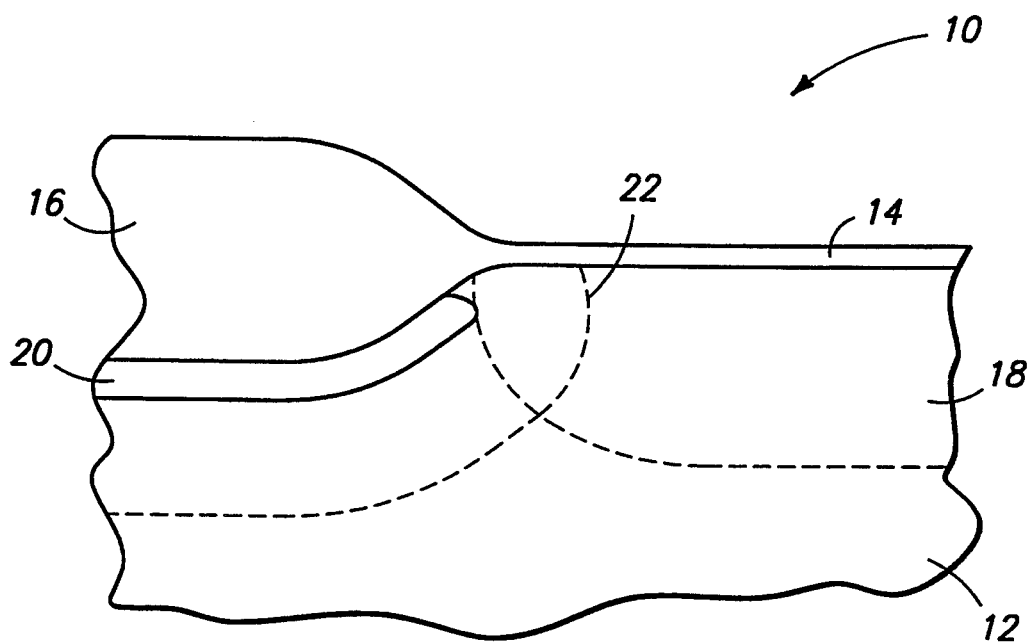
FIG. 1 is a diagrammatic section view of a semiconductor wafer fragment, and is discussed in the "Background" section above.
Figure 2:
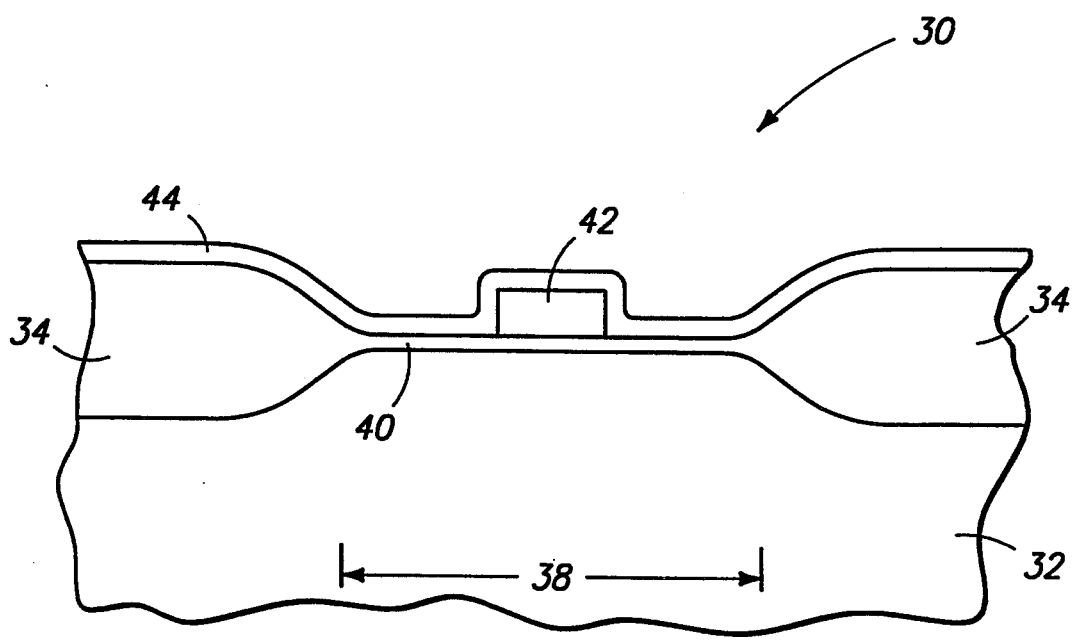
FIG. 2 is a diagrammatic section view of a semiconductor wafer fragment at one processing step in accordance with the invention.

More particularly and with reference to the Figures, a semiconductor wafer fragment at one processing step in accordance with the invention is illustrated in FIG. 2 generally with reference numeral 30. Fragment 30 is comprised of a bulk substrate 32 which has been oxidized to define field oxide regions 34, and what will be an active region 38. A gate oxide layer 40 has also been provided. A fully patterned floating gate 42 is provided atop semiconductor substrate 32, over gate oxide layer 40, within active region area 38. In the preferred embodiment, field oxide regions 34 are provided before fully patterned floating gate 42 is provided relative to the substrate. A floating gate dielectric layer 44 is next provided outwardly of floating gate 42. Such preferably comprises a conventional oxide-nitride-oxide (ONO) sandwich. At this point in the preferred process, enhancement patterning and implant of peripheral devices would preferably occur.

Figure 3:
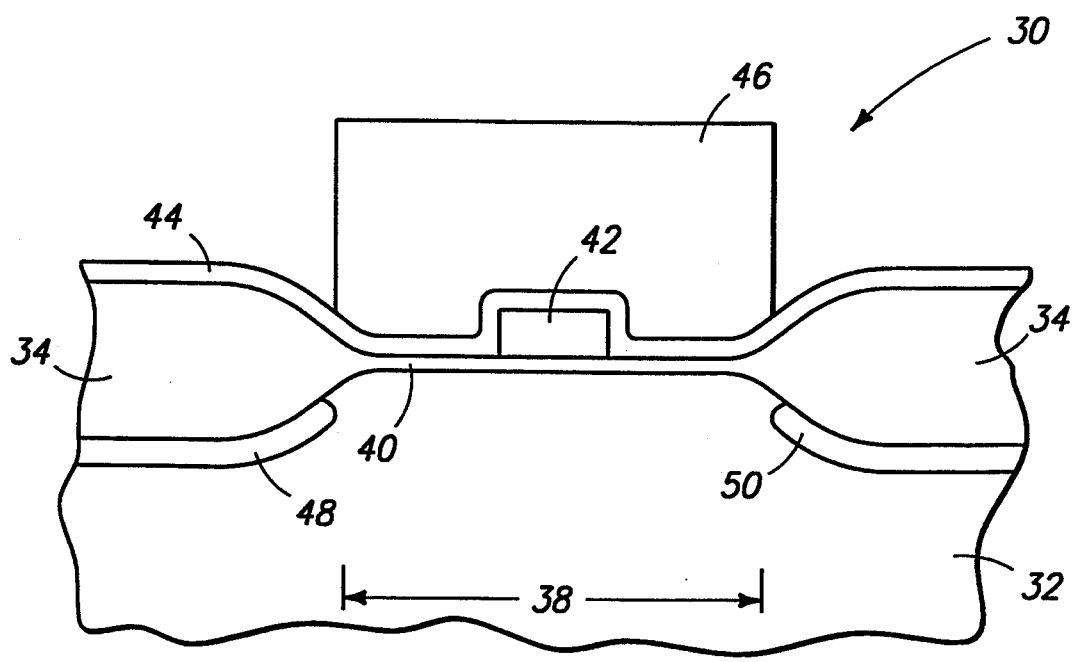
FIG. 3 is a view of the FIG. 2 wafer fragment shown at a processing step subsequent to that shown by FIG. 2.

Referring to FIG. 3, a layer of photoresist is deposited and patterned to produce a photoresist mask 46 over active region 38. Thereafter, ion implantation is conducted through field oxide regions 34 to within bulk substrate 32 beneath the field oxide regions with a suitable conductivity enhancing impurity to form desired channel stop regions 48 and 50. Accordingly in the illustrated and preferred embodiment, floating gate dielectric layer 44 is provided before the masking and channel stop implant steps, and the channel stop implant step is conducted through floating gate dielectric layer 44. An example and preferred ion implantation step of a p-dopant would be boron at from 140 keV–180 keV, at a dose of $1 \times 10^{12} - 1 \times 10^{13}$ ions/cm$^2$.

Figure 4:
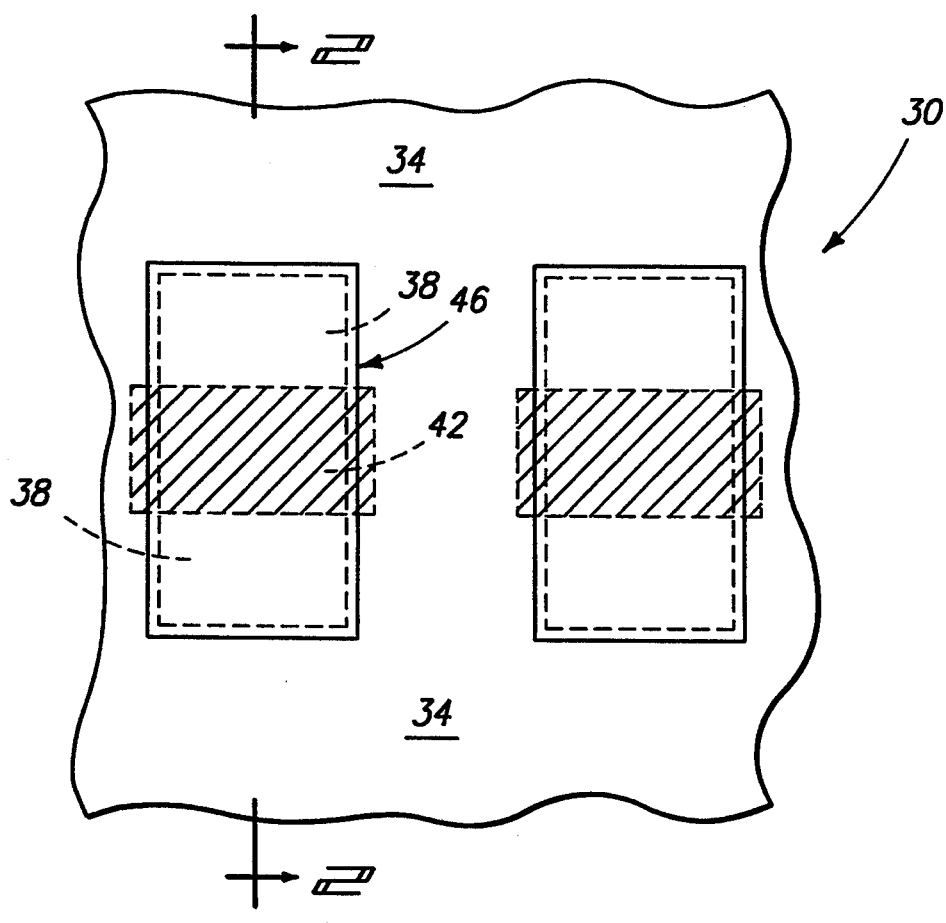
FIG. 4 is a diagrammatic top view of FIG. 3. Section line A—A represents the location and orientation of the cut where each of FIGS. 2, 3, 5 and 6 are taken at their respective points in preferred embodiment process.

FIG. 4 illustrates a top plan view of the wafer fragment during the ion implantation step of FIG. 3.

Figure 5:
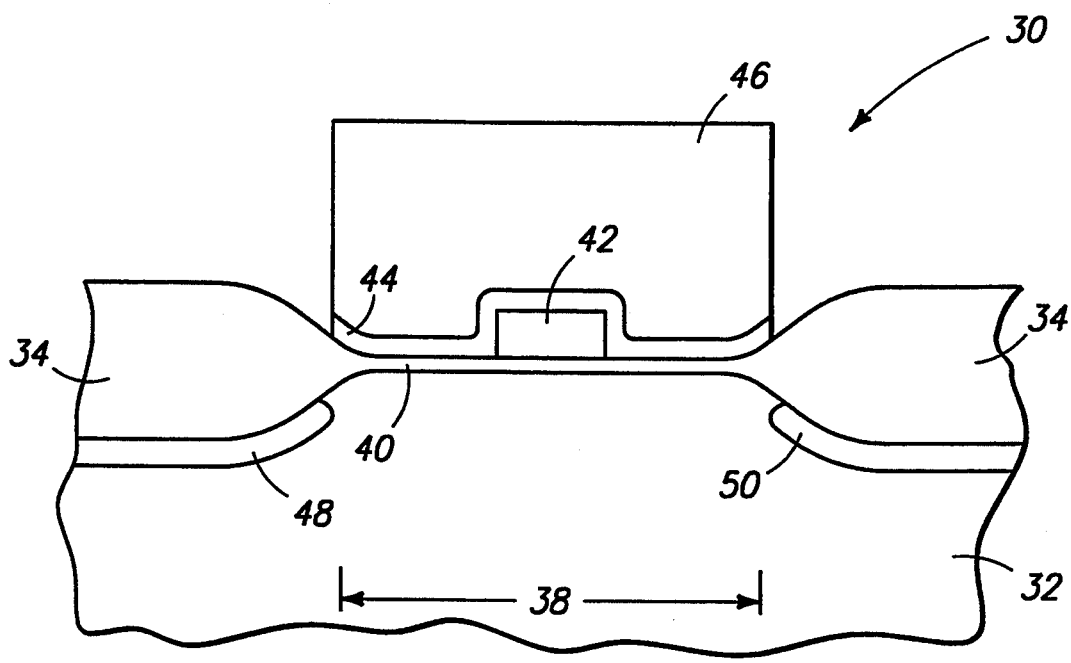
FIG. 5 is a view of the FIG. 2 wafer fragment shown at a processing step subsequent to that shown by FIG. 3.

Referring to FIG. 5, channel stop implant mask 46 is also utilized as a mask for stripping exposed portions of floating gate dielectric layer 44 from atop field oxide regions 34. Typically, some peripheral and array masking occurs during the same steps. Mask 46 patterning would, however, typically only be provided within the array.

In the above described embodiment, the ion implantation occurred through layer 44 over the field oxide regions prior to removal of layer 44. Alternately in accordance with the invention, the exposed floating gate dielectric layer material overlying the field oxide regions can be removed before the channel stop implant step. In such instance, applied energy for the ion implant might be reduced to fall within the range of 150 keV–250 keV, with the dose remaining within the same range as referred to above. Regardless, it is most preferable that the ion implantation masking block 46 be utilized for both ion implantation and ONO layer 44 stripping. Complete or full patterning of floating gate 42 prior to ion implantation enables all of the desired field oxide regions to be outwardly exposed, enabling blanket ion implantation therethrough.

Figure 6:
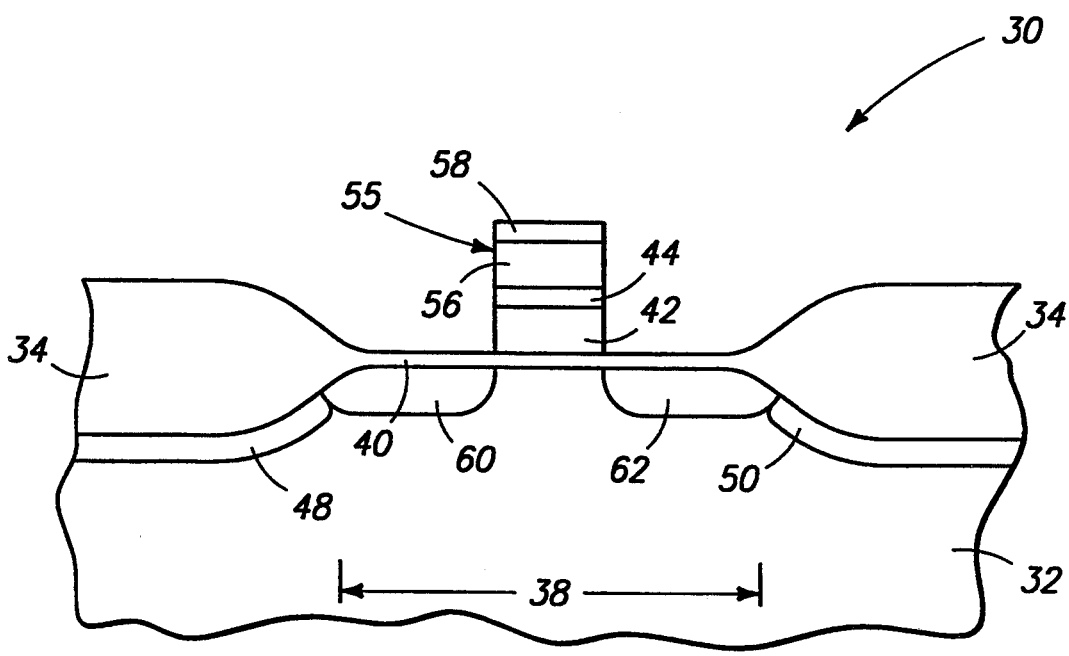
FIG. 6 is a view of the FIG. 2 wafer fragment shown at a processing step subsequent to that shown by FIG. 5.
Figure 7:
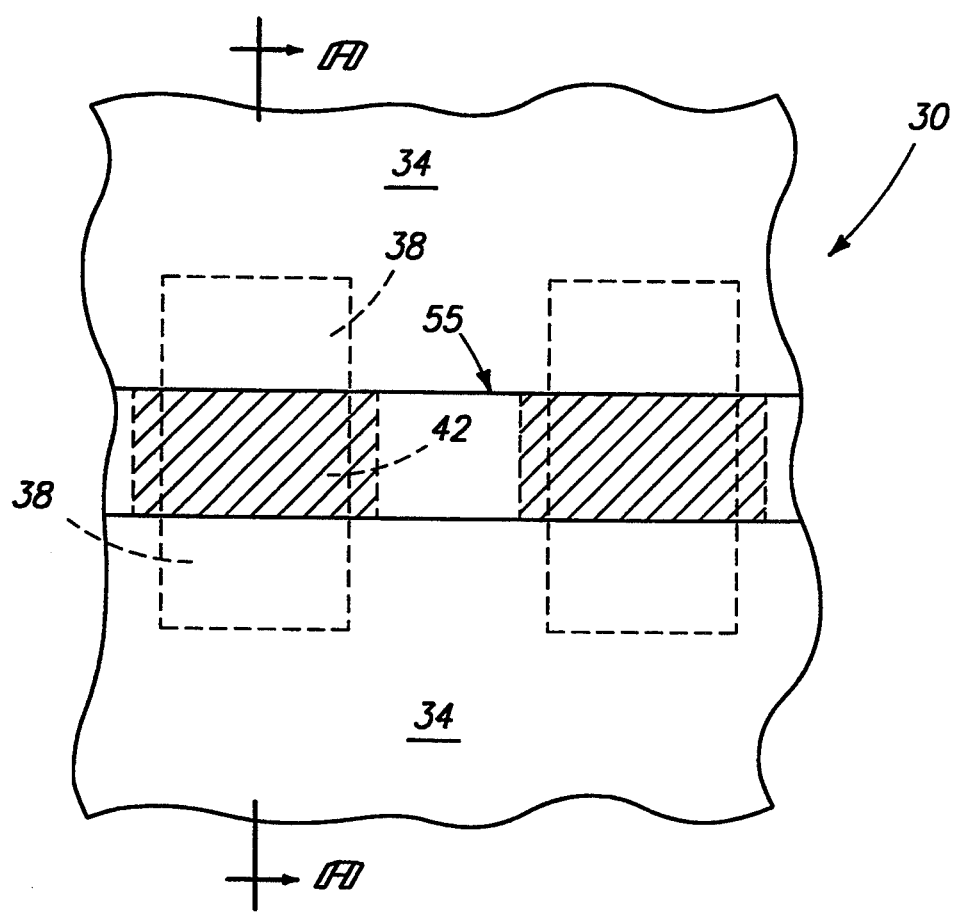
FIG. 7 is a diagrammatic top view of FIG. 6.

Referring to FIG. 6, after conducting the channel stop implant, a patterned word line 55 (comprised of conductively doped poly 56 and overlying silicide 58) is provided over floating gate dielectric layer 44, as shown. Subsequent conductivity enhancing doping is conducted through gate oxide layer 40 into bulk substrate 32 to produce the illustrated source/drain regions 60 and 62. FIG. 7 illustrates a top plan view of the finished construction.

At this point in the preferred process, patterning for and desired gate oxide formation for peripheral devices occurs. Typically, the desired thin nature of the conventional gate oxide layer 40 of a floating gate programmable read only memory cell transistor is too thin to be utilized as gate oxide for peripheral devices. Accordingly, appropriately thicker gate oxide is typically provided for the peripheral devices. In the context of this invention, the preferred time for doing so is after removal of mask 46 and before deposition of layer 56.

The above described process previously deposits and completely patterns the floating gate layer 42, thereby eliminating what would otherwise be subjecting the wafer and implant regions 48 and 50 to greater heat diffusion as a result of the steps which provide floating gate 42. Accordingly, undesired diffusion of regions 48 and 50 is reduced. In the prior art, masking and channel stop implantation never occurred until after complete formation of both the floating gates and word lines.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a floating gate programmable read only memory cell transistor in a semiconductor substrate comprising the following steps:
   providing a fully patterned floating gate atop the semiconductor substrate;
   oxidizing the semiconductor substrate to define a field oxide region and an active region, the floating gate being provided within the active region;
   providing a floating gate dielectric layer outwardly of the floating gate;
   after providing the floating gate and the field oxide region, masking the active region while conducting a channel stop implant through the field oxide region to within the substrate beneath the field oxide region; and
   after conducting the channel stop implant, providing a patterned word line over the floating gate dielectric layer.

2. The method of forming a floating gate programmable read only memory cell transistor of claim 1 wherein the floating gate dielectric layer is provided before the masking and channel stop implant steps.

3. The method of forming a floating gate programmable read only memory cell transistor of claim 1 wherein the floating gate dielectric layer is provided before the masking and channel stop implant steps; and wherein the channel stop implant step is also conducted through the floating gate dielectric layer.

4. The method of forming a floating gate programmable read only memory cell transistor of claim 1 wherein the floating gate dielectric layer is provided before the masking and channel stop implant steps; and wherein floating gate dielectric layer material overlying the field oxide region is removed before the channel stop implant step.

5. The method of forming a floating gate programmable read only memory cell transistor of claim 1 wherein the floating gate dielectric layer is provided before the masking and channel stop implant steps; and wherein floating gate dielectric layer material overlying the field oxide region is removed after the masking step and before the channel stop implant step using the masking step mask.

6. The method of forming a floating gate programmable read only memory cell transistor of claim 5 wherein the field oxide region is provided before the fully patterned floating gate is provided.

7. The method of forming a floating gate programmable read only memory cell transistor of claim 5 wherein the floating gate dielectric layer is provided before the masking and channel stop implant steps.

8. The method of forming a floating gate programmable read only memory cell transistor of claim 5 wherein the floating gate dielectric layer is provided before the masking and channel stop implant steps; and wherein the channel stop implant step is also conducted through the floating gate dielectric layer.

9. The method of forming a floating gate programmable read only memory cell transistor of claim 5 wherein the floating gate dielectric layer is provided before the masking and channel stop implant steps; and wherein floating gate dielectric layer material overlying the field oxide region is removed before the channel stop implant step.

10. The method of forming a floating gate programmable read only memory cell transistor of claim 5 wherein the floating gate dielectric layer is provided before the masking and channel stop implant steps; and wherein floating gate dielectric layer material overlying the field oxide region is removed after the masking step and before the channel stop implant step using the masking step mask.

* * * * *